(12) United States Patent
Wang et al.

(10) Patent No.: US 9,406,625 B2
(45) Date of Patent: Aug. 2, 2016

(54) DIE EDGE SEAL EMPLOYING LOW-K DIELECTRIC MATERIAL

(71) Applicants: Zhijie Wang, Tianjin (CN); Zhigang Bai, Tianjin (CN); Jiyong Niu, Tianjin (CN); Dehong Ye, Tianjin (CN); Huchang Zhang, Tianjin (CN)

(72) Inventors: Zhijie Wang, Tianjin (CN); Zhigang Bai, Tianjin (CN); Jiyong Niu, Tianjin (CN); Dehong Ye, Tianjin (CN); Huchang Zhang, Tianjin (CN)

(73) Assignee: FREESCALE SEMICONDCUTOR, INC., Austin, TX (US)

( * ) Notice: Subject to any disclaimer, the term of this patent is extended or adjusted under 35 U.S.C. 154(b) by 0 days.

(21) Appl. No.: 14/555,558

(22) Filed: Nov. 26, 2014

(65) Prior Publication Data

US 2015/0371957 A1    Dec. 24, 2015

(30) Foreign Application Priority Data

Jun. 19, 2014    (CN) .......................... 2014 1 0274241

(51) Int. Cl.
*H01L 23/544* (2006.01)
*H01L 27/118* (2006.01)
*H01L 41/338* (2013.01)
*H01L 23/00* (2006.01)
*H01L 23/58* (2006.01)
*H01L 21/78* (2006.01)
*H01L 21/66* (2006.01)

(52) U.S. Cl.
CPC .............. *H01L 23/562* (2013.01); *H01L 21/78* (2013.01); *H01L 23/585* (2013.01); *H01L 22/34* (2013.01); *H01L 2924/0002* (2013.01)

(58) Field of Classification Search
CPC ....... H01L 22/32; H01L 23/585; H01L 21/78; H01L 2223/5446
USPC .......................................... 438/462; 257/620
See application file for complete search history.

(56) References Cited

U.S. PATENT DOCUMENTS

| 7,129,566 | B2 | 10/2006 | Uehling |
| 7,741,196 | B2 | 6/2010 | Yip |
| 7,977,232 | B2 | 7/2011 | Eto |
| 8,253,217 | B2 | 8/2012 | Chen |
| 8,368,180 | B2 * | 2/2013 | Yu ........................... H01L 21/78 257/620 |
| 8,461,021 | B2 | 6/2013 | Yaung |
| 2003/0077897 | A1 * | 4/2003 | Tsai .................. H01L 21/76807 438/633 |
| 2007/0013071 | A1 * | 1/2007 | Adkisson ................ H01L 22/32 257/758 |
| 2007/0087067 | A1 | 4/2007 | Yuan |
| 2007/0275539 | A1 * | 11/2007 | Rashid ............... G01R 31/2884 438/460 |
| 2009/0121321 | A1 * | 5/2009 | Miccoli ............... G03F 7/70625 257/618 |
| 2010/0072578 | A1 * | 3/2010 | Kunishima ............ H01L 23/585 257/620 |

(Continued)

*Primary Examiner* — Moazzam Hossain
(74) *Attorney, Agent, or Firm* — Charles E. Bergere

(57) ABSTRACT

A semiconductor wafer has a multi-stage structure that damps and contains nascent cracks generated during dicing and inhibits moisture penetration into the active region of a die. The wafer includes an array of die regions separated by scribe lanes. The die regions include an active region and a first ring that surrounds the active region. A portion of the first ring includes a low-k dielectric material. A second ring includes a stack of alternating layers of metal and interlayer dielectric (ILD) material. A dummy metal region around the rings includes a stacked dummy metal features and surrounds the active region. A regular or irregular staggered arrangement of saw grid process control (SGPC) features reduces mechanical stress during dicing.

17 Claims, 4 Drawing Sheets

(56) References Cited

U.S. PATENT DOCUMENTS

| | | | |
|---|---|---|---|
| 2010/0289021 A1* | 11/2010 | Wu | H01L 21/78 257/48 |
| 2012/0080673 A1* | 4/2012 | Winter | H01L 23/544 257/48 |
| 2012/0126228 A1* | 5/2012 | Fischer | H01L 23/585 257/48 |
| 2013/0049195 A1* | 2/2013 | Wu | H01L 24/97 257/738 |
| 2013/0221353 A1* | 8/2013 | Yang | H01L 22/34 257/48 |
| 2013/0320235 A1* | 12/2013 | Lien | H01L 21/67115 250/454.11 |
| 2014/0232001 A1* | 8/2014 | Gratz | H01L 21/768 257/762 |
| 2014/0264767 A1* | 9/2014 | Gratz | H01L 21/78 257/620 |
| 2014/0319522 A1* | 10/2014 | Daubenspeck | H01L 24/11 257/48 |
| 2014/0339558 A1* | 11/2014 | Chen | H01L 22/14 257/48 |
| 2015/0155263 A1* | 6/2015 | Farooq | H01L 23/544 257/620 |

\* cited by examiner

US 9,406,625 B2

DIE EDGE SEAL EMPLOYING LOW-K DIELECTRIC MATERIAL

BACKGROUND OF THE INVENTION

The present invention relates generally to the fabrication of semiconductor dies, and more particularly to protection against the propagation of cracks and delaminations that occur during the fabrication of semiconductor dies.

An individual integrated circuit or chip is usually formed from a larger, semiconductor wafer, which usually comprises primarily silicon, although other materials such as gallium arsenide and indium phosphide may be used. The semiconductor wafer is fabricated to include a plurality of integrated circuits arranged in rows and columns, with the periphery of each integrated circuit typically being square or rectangular in shape.

Typically, after fabrication, the semiconductor wafer is singulated (or "sawed" or "diced"), using a dicing tool such as a dicing saw, into the square or rectangular-shaped discrete integrated circuits. The cuts are made along mutually perpendicular sets of parallel lines, sometimes referred to as saw streets or scribe lanes, located between the rows and columns of integrated circuits. Each singulated integrated circuit is typically referred to as a semiconductor die.

During fabrication and assembly (packaging), the peripheries of the semiconductor dies are prone to damage. Such damage may occur, for example, during dicing, packaging, processing, or testing. Generally, the corners and edges of a semiconductor die are under more stress relative to the center of the die. For example, during the dicing process, the dicing tool can induce stresses on the semiconductor wafer that cause the die edge to chip, crack, peel, or otherwise be damaged, leading to crack propagation through one or more of the dies, and severely damaging or degrading the resultant integrated circuit. During packaging, processing, and testing, the semiconductor die may be subjected to thermal cycling, which causes additional stress to the die corners and edges.

Damage that occurs at the corners and edges of a die can easily propagate into the active region of the die, resulting in damage to some or all of the die's interconnections or circuitry, thereby compromising its reliability. For example, cracks may propagate from the edges and corners into the active region of the semiconductor die. Also, the edges and corners are more prone to delamination, which also propagates into the active region. Conventional schemes for protecting the active region of the die may not be sufficiently effective against the propagation of such cracks and delamination, thereby resulting in reduced reliability and increased processing cost. Accordingly, it would be advantageous to be able to more effectively protect the die edges from damage.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of connections and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

One embodiment of the present invention is a semiconductor wafer including an array of die regions separated by scribe lanes. At least one die region includes an active region and a first ring at least partially surrounding the active region. At least a portion of the first ring includes a low-k dielectric material.

Figure 1:
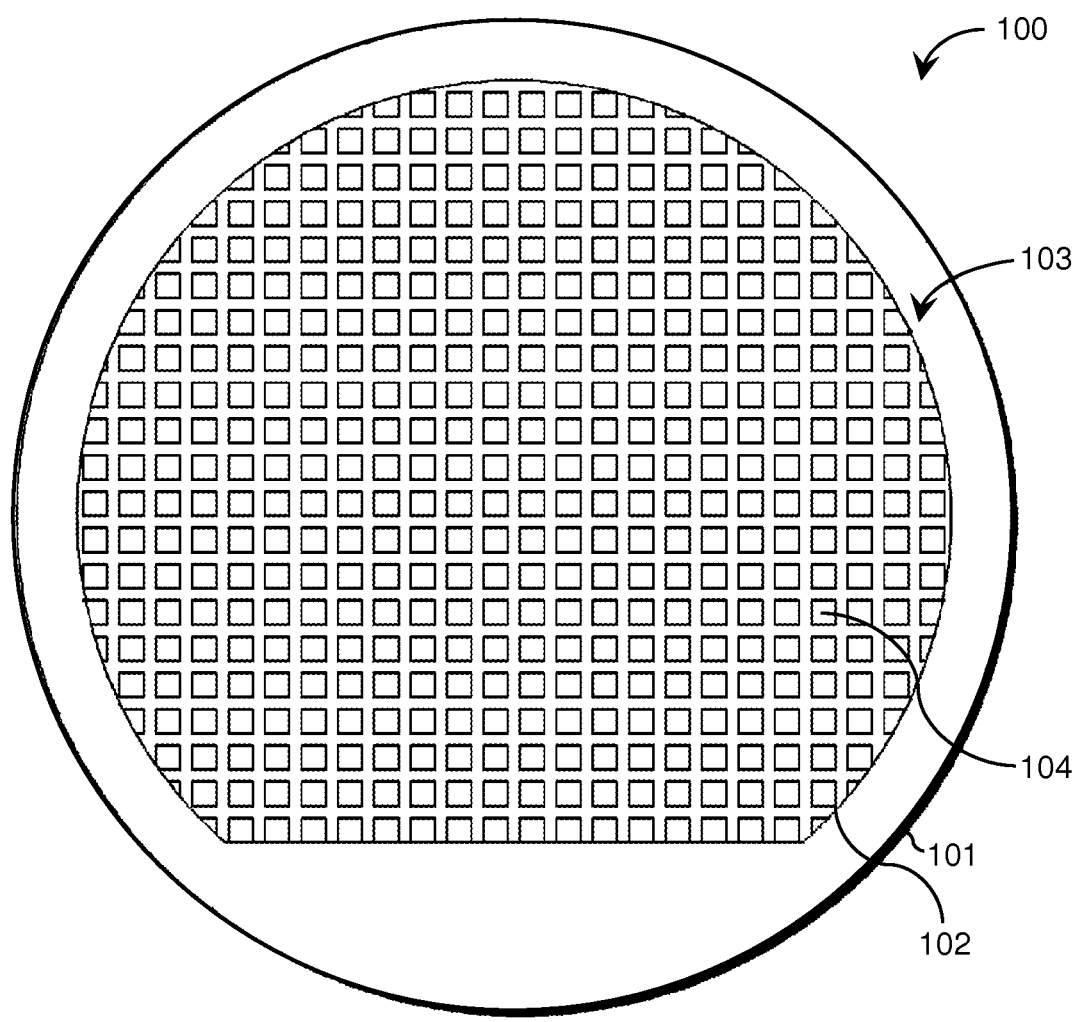
FIG. 1 is a simplified plan view of a semiconductor wafer in accordance with one embodiment of the present invention.

Referring now to FIG. 1, a simplified plan view of a semiconductor wafer 100 is shown. The semiconductor wafer 100 includes a substrate 101 and a plurality of upper layers 102 on the substrate 101 that are arranged to provide a formation 103 of die regions 104 arranged in a truncated circular array. Each die region 104 provides a die, i.e., an integrated circuit including one or more microelectronic circuits. A die is a well-known component of semiconductor devices, and thus, a detailed description thereof is not necessary for a complete understanding of the invention.

Figure 2:
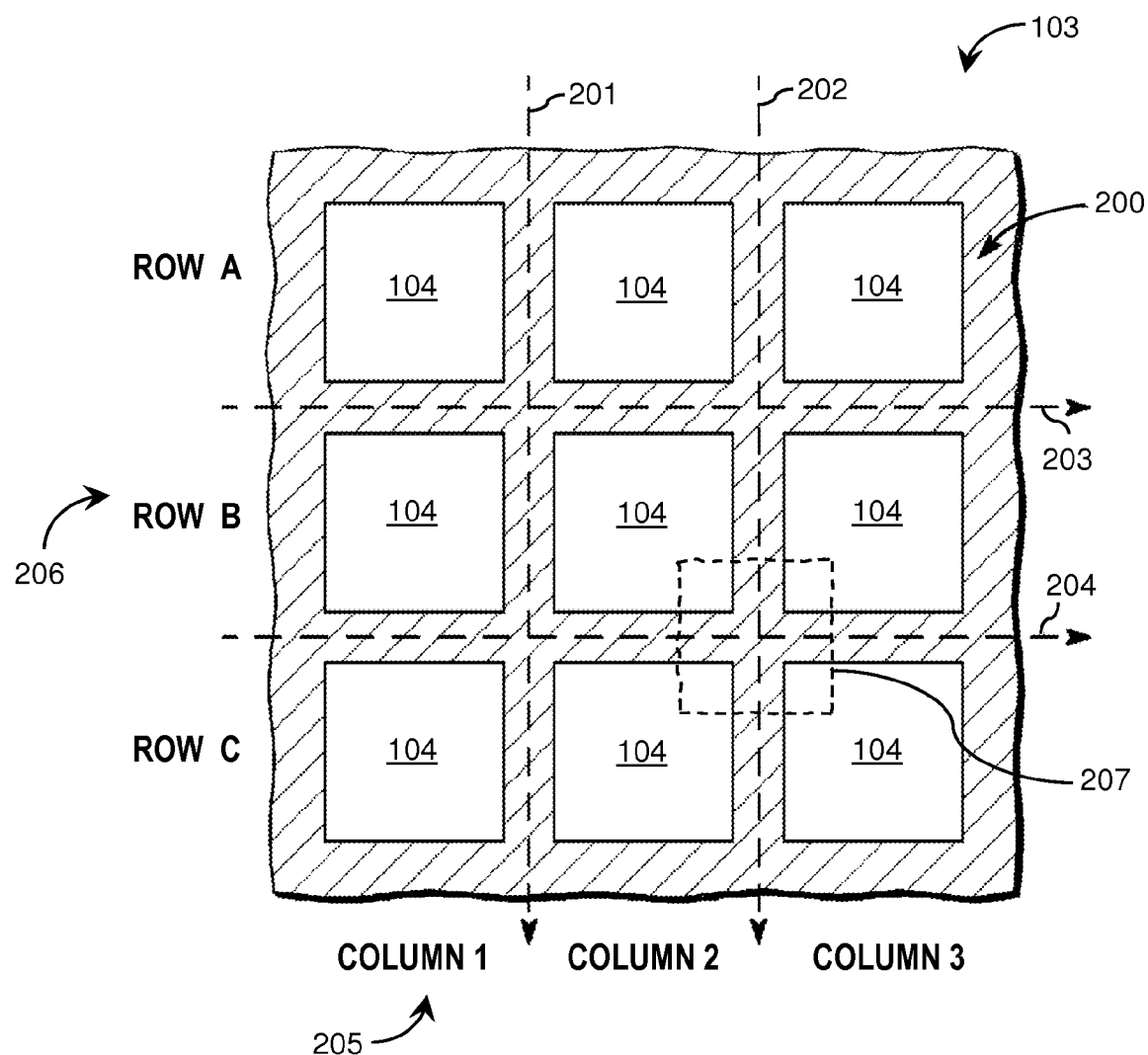
FIG. 2 is an enlarged, simplified plan view of a sub-array of the die regions illustrated in FIG. 1.

FIG. 2 shows an enlarged, simplified plan view of a sub-array of the die regions 104 illustrated in FIG. 1. As can be seen in more detail in FIG. 2, the formation 103 of die regions 104 is arranged to provide a region 200 (shown in hatched lines) comprising scribe lanes 201, 202, 203, 204, which are intersecting paths for a dicing tool.

Scribe lanes 201 and 202 are located between columns 205 of the die regions 104, and scribe lanes 203 and 204 are located between rows 206 of the die regions 104. Scribe lanes 201, 202 are arranged to be mutually perpendicular with respect to scribe lanes 203, 204. In other words, adjacent die regions 104 are separated by scribe lanes 201, 202, 203, 204 so that, for example, the die regions 104 of ROW A are separated from the die regions 104 of ROW B by the scribe lane 203. Thus, in order to singulate die regions 104, a dicing tool must traverse each of the scribe lanes 201, 202, 203, 204 to separate each die region 104. In the present case, a dicing of the formation 103 of the die regions 104 depicted in FIG. 2 would yield nine dies.

Figure 3:
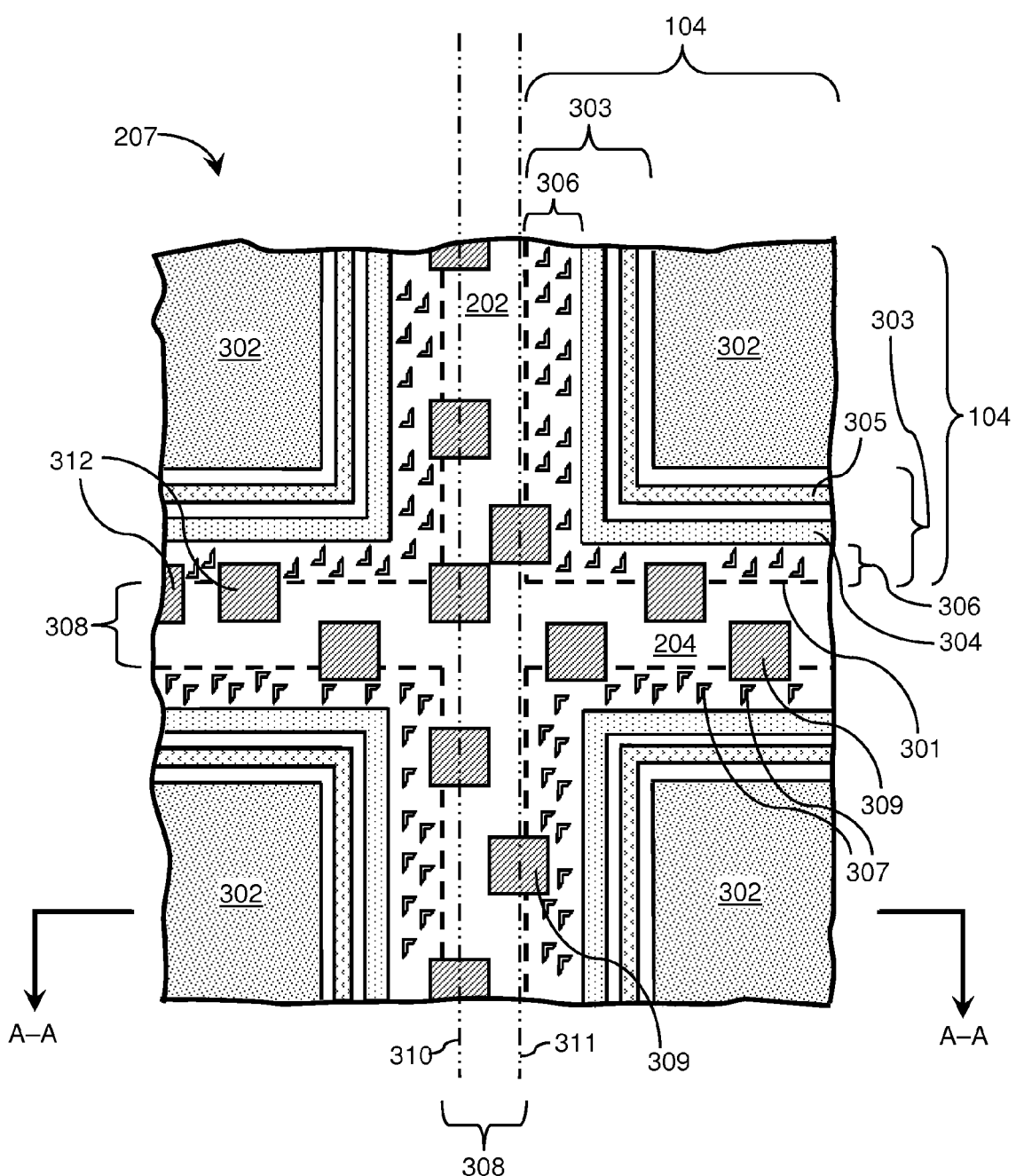
FIG. 3 is an enlarged plan view of the dashed region of FIG. 2, at the intersection of two scribe lanes.
Figure 4:
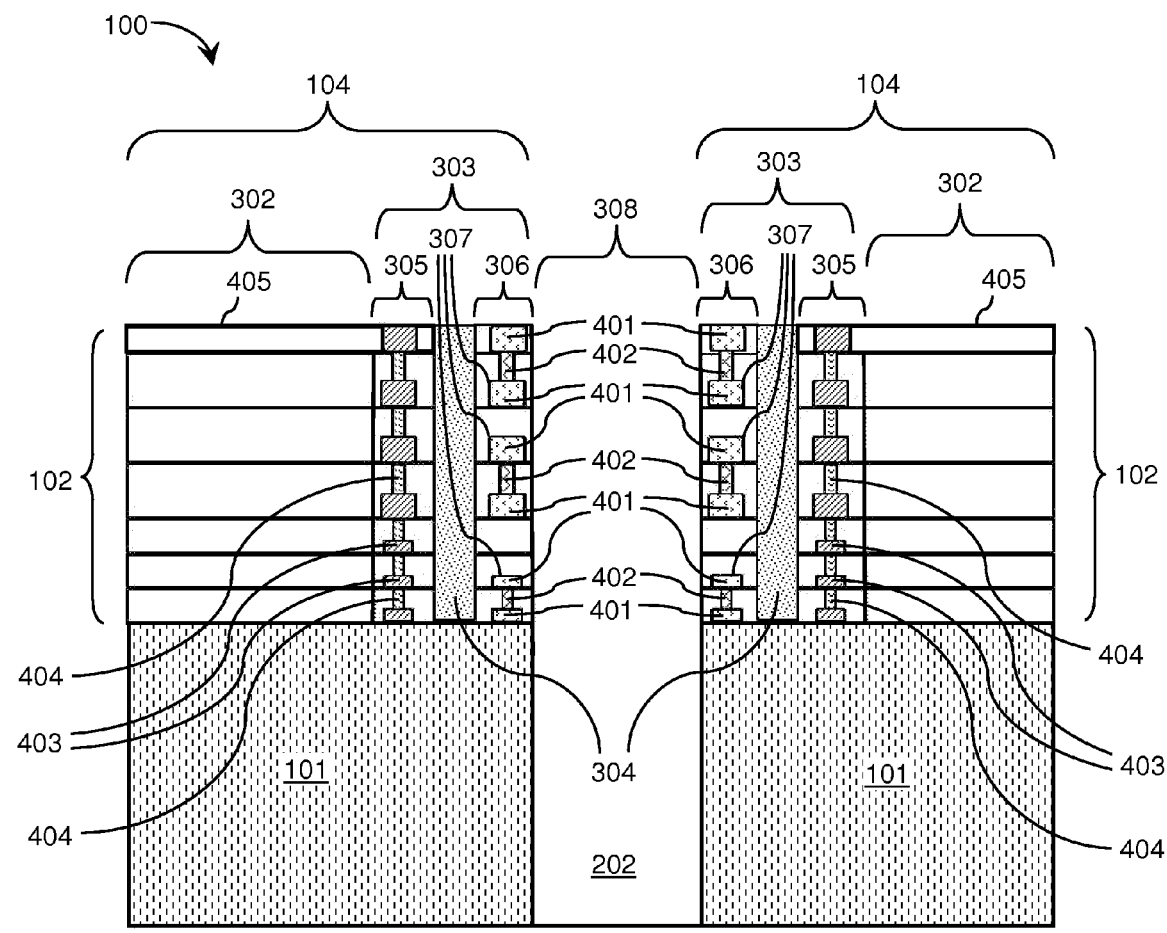
FIG. 4 is a partial cross-sectional side view of a portion of the dashed region of FIG. 2 taken along plane A-A of FIG. 3.

FIG. 3 shows an enlarged plan view of dashed region 207 of FIG. 2, at the intersection of scribe lanes 202 and 204, and FIG. 4 shows a partial cross-sectional side view of a portion of the dashed region 207 taken along plane A-A of FIG. 3.

As shown in FIG. 3, each die region 104 (indicated by dashed lines 301, which is not part of the actual structure) includes an active region 302 separated from adjacent scribe lanes 202, 204 by a respective sealing region 303 that surrounds the active region 302. The active region 302 may include any suitable types of interconnections and circuitry to implement any suitable variety of functions for a semiconductor die and may be formed using conventional processing techniques. The active region 302 is a well-known component of semiconductor devices, and thus, a detailed description thereof is not necessary for a complete understanding of the invention.

The sealing region 303 includes a first die-edge sealing ring 304, a second die-edge sealing ring 305, and a dummy metal region 306. The sealing region 303 also includes portions of scribe-grid process-control (SGPC) features 309, which are discussed in further detail below.

The first die-edge sealing ring 304 surrounds the second die-edge sealing ring 305, which surrounds the active region 302. In the illustrated embodiment, the first and second die edge sealing rings 304 and 305 are illustrated as being continuous rings; however, in alternative embodiments, one or both of these rings might not be continuous and might include one or more gaps. Also, as will be discussed in further detail below, the rings 304 and 305 may have forms other than the rectangular profiles illustrated in FIG. 3. For example, one or both of the rings 304, 305 may have at least one rounded corner, or at least one tapered corner that includes an edge that cuts across the corner. In some embodiments, the rings 304 and 305 might only partially surround the active region 302. For example, in one embodiment, the second die edge sealing ring 305 might only partially surround the active region 302, and the first die edge sealing 304 might then only partially surround the second ring 305.

In effect, each first die-edge sealing ring 304 provides a first protective barrier that circumscribes a respective active region 302. Each second die-edge sealing ring 305 provides a second protective barrier disposed within the barrier formed by first die-edge sealing ring 304, which also circumscribes that same respective active region 302. Additional details regarding first die-edge sealing ring 304 and second die-edge sealing ring 305 will be discussed below.

As will now be discussed in further detail, the dummy metal region 306 provides a third protective barrier within which the first and second die-edge sealing rings 304 and 305 are disposed, which also circumscribes that same respective active region 302.

As shown in FIG. 3, each dummy metal region 306 contains a plurality of dummy elements 307 disposed between corresponding sealing ring 304 and corresponding dashed lines 301 and having generally L-shaped or V-shaped layouts. Dashed lines 301 are defined as the edges of saw-blade kerf region 308, i.e., the region within which material removed during dicing is contained. As shown in FIG. 4, each dummy element 307 consists of a vertical arrangement of two first dummy metal features 401 sandwiching a narrower, second dummy metal feature 402. FIG. 4 also shows that, below each dummy element 307 at the upper surface of a dummy metal region 306 are a number (e.g., two in this exemplary embodiment) of other instances of dummy element 307.

In other embodiments, dummy metal features 401, 402 of dummy elements 307 may include other types of shapes, including those having other regular geometric cross sections, and even irregular geometric shapes.

It should be noted that, by keeping saw-blade kerf regions (e.g., 308) free of dummy metal features, embodiments of the invention reduce mechanical stress on the saw blade relative to known arrangements of dummy features, which are typically disposed within saw-blade kerf regions.

Dummy metal features 401, 402 may comprise metals such as copper, aluminum, tungsten, gold, or other metals and are desirably distributed in a relatively high-density pattern within dummy metal region 306, in order to serve as a crack-penetration barrier by absorbing some degree of mechanical energy to prevent cracks from propagating into active region 302 during the dicing process.

Within each of scribe lanes 202 and 204, a scribe-grid process-control (SGPC) pattern comprising a plurality of metal SGPC features 309 is disposed. SGPC features 309 are structures arranged in patterns, formed within scribe lanes 202 and 204 during wafer fabrication, and are used for various process control and monitoring purposes, including, e.g., mask alignment, physical dimension measurement, and parasitic parameter measurement. The use of SGPC features to control and monitor wafer fabrication processes is well known, and thus, a detailed description thereof is not necessary for a complete understanding of the invention.

In this embodiment, at least a portion of each SGPC feature 309 is disposed within both (i) saw-blade kerf region 308 and (ii) one of dummy metal regions 306, such that the saw blade engages these SGPC features 309 during dicing.

Conventionally, an SGPC pattern comprises a plurality of SGPC features disposed centrally within a scribe lane and aligned along a single line. However, in this embodiment of the invention, as best seen in FIG. 3, SGPC features 309 are instead spaced further apart and (regular or irregular) staggered side to side within each SGPC pattern to reduce stress on the silicon during dicing. This is because nascent cracks and chips, which are a chief source of deterioration of silicon chip integrity, are less likely to occur when the dicing saw blade passes through silicon that has a reduced density of metal regions relative to conventional centrally-disposed SGPC patterns.

In a regular staggered pattern, consecutive SGPC features in the pattern are offset to different sides of the scribe lane without exception. In the embodiment shown in FIG. 3, each SGPC pattern comprises a plurality of SGPC features 309 disposed along its respective scribe lane 202, 204 in an irregular staggered pattern. In these irregular staggered patterns, SGPC features 309 are aligned along two different parallel lines (for example, first line 310 and second line 311 in scribe lane 202 as shown in FIG. 3). These patterns are irregular staggered patterns, because at least two consecutive SGPC features 312 disposed along a given scribe lane 204 are offset to the same side of the scribe lane.

It should be noted that, by avoiding the use of SGPC features 309 disposed centrally within saw scribe lanes (e.g., 202), embodiments of the invention reduce mechanical stress on the saw blade relative to known arrangements of SGPC features. Conventionally, SGPC features are typically disposed densely in a single, straight line, and centrally within a saw scribe lane, creating a dense path of metal through which the saw blade must travel during dicing. However, by using a generally staggered, less-dense arrangement of SGPC features 309, such as the arrangement shown in FIG. 3, the dicing saw blade travels through less metal and is subjected to less mechanical stress.

As shown in the partial cross-sectional view of FIG. 4, semiconductor wafer 100 includes substrate 101 and a plurality of upper layers 102 disposed on substrate 101.

In active region 302, upper layers 102 include conductive and non-conductive features (not shown) that are interconnected and arranged to form microelectronic circuits. The processes and techniques for forming the microelectronic circuits in active region 302 are well-known, and thus, a detailed description thereof is not necessary for a complete understanding of the invention.

The substrate 101 is typically a silicon substrate, although the substrate 101 can be made from any suitable semiconductor material or combination of materials, such as gallium arsenide, indium phosphide, silicon germanium, silicon-on-insulator (SOI), silicon, monocrystalline silicon, or the like, and combinations thereof.

As shown in FIG. 4, the semiconductor wafer 100 includes a plurality of the first die-edge sealing rings 304, each of which extends between a top surface 405 of the semiconductor wafer 100 and through to the substrate 101 so as to circumscribe both a respective active region 302 and a respective second die-edge sealing ring 305.

Each first die-edge sealing ring 304 is initially formed as a continuous trench using any suitable manufacturing process, such as, for example, photolithography, wet or dry etching, laser processes, or the like. The width of each first die-edge sealing ring 304 may be, e.g., between about 5 µm and about 8 µm.

In the illustrated embodiment, each first die-edge sealing ring 304 has a generally rectangular-shaped cross sectional profile. However, other cross-sectional profiles, such as, for example, a wedge shape, may be used.

Unlike conventional sealing rings that are either completely hollow or contain metal features (such as a pattern of stacked metal and interlayer dielectric layer (ILD) material), each first die-edge sealing ring 304 in the illustrated embodiment is filled with a porous, low-k dielectric material, e.g., a material having a dielectric constant (k) less than approximately 4. A low-k material is an insulating material that exhibits weak polarization when subjected to an externally applied electric field and is substantially free or completely free of metal. Use of a low-k dielectric material in first die-edge sealing rings 304 permits each first die-edge sealing ring 304 to act as a crack-penetration barrier by increasing the amount of free surface energy, referred to as "crack surface energy." An increase in crack surface energy is caused by the low-k material damping mechanical energy, such that, when the leading edge of a crack reaches the first die-edge sealing ring 304, its mechanical energy is insufficient to overcome the surface energy of the first die-edge sealing ring 304 to allow the crack to travel further, thereby protecting the active region 302.

Additionally, each first die-edge sealing ring 304 acts as a barrier against moisture penetration into the respective active region 302.

Exemplary low-k materials for filling the first die-edge sealing rings 304 include one or more of: fluorinated (fluorine-doped) $SiO_2$ with a k value of about 3.0 to about 3.7, organosilane with a k value of about 2.5 to about 2.7, and amorphous fluorocarbon with a k value of about 2.0 to about 2.5. Other low-k materials that may be employed include (without limitation) one or more of: carbon-doped silicon dioxide (with a k value of about 3.0), porous silicon dioxide (with a k values lower than about 2.0), porous carbon-doped silicon dioxide, a spin-on organic polymeric dielectric (e.g., polyimide, polynorbornenes, benzocyclobutene, and polytetrafluoroethylene (PTFE)), and a spin-on silicon-based polymeric dielectric (e.g., hydrogen silsesquioxane (HSQ) and methylsilsesquioxane (MSQ)).

Filling the first die-edge sealing rings 304 with a low-k material preferably occurs during wafer fabrication. In one embodiment, a low-k material is applied to the semiconductor wafer 100 as a final wafer surface during wafer fabrication.

The first die-edge sealing rings 304 are desirably completely filled or substantially completely filled with the low-k material, although, in some embodiments, one or more first die-edge sealing rings 304 may be only partially filled with the low-k material. In embodiments where a first die-edge sealing ring 304 is only partially filled with the low-k material, the remaining portion of first die-edge sealing ring 304 may either be left empty or filled with another material. In alternative embodiments, more than one type of low-k material may be included within a single first die-edge sealing ring 304, and these different types of low-k material may either be intermixed or applied separately, such as by being applied sequentially in layers. In some embodiments, different first die-edge sealing rings 304 may include different low-k materials.

As also shown in FIG. 4, the semiconductor wafer 100 further includes a plurality of second die-edge sealing rings 305, each of which extends between the top surface 405 of the semiconductor wafer 100 and through to the substrate 101 so as to circumscribe a respective active region 302.

The width of each second die-edge sealing ring 305 may be, e.g., between about 5 µm and about 8 µm.

Each second die-edge sealing ring 305 is formed from a vertical stack of alternating layers of metal 403 (which may comprise one or more of copper, aluminum, tungsten, gold, or other suitable metals) and interlayer dielectric layer (ILD) material 404 (which may comprise one or more of an oxide, a nitride, an oxynitride, silicon dioxide, a nitrogen-bearing oxide, a nitrogen-doped oxide, silicon nitride, silicon oxynitride, or another suitable dielectric material).

Although, in this embodiment, features of the metal 403 and the ILD material 404 have generally rectangular or square cross-sections, in other embodiments, features of the metal 403 and the ILD material 404 may include other suitable types of shapes, including those having other regular geometric cross sections and even irregular geometric shapes.

The second die-edge sealing ring 305 provides an additional, second protective barrier disposed within the barrier formed by the first die-edge sealing ring 304, to further damp mechanical cracking energy during the saw dicing process, thereby preventing cracks from entering the active region 302. Additionally, the second die-edge sealing ring 305 provides an additional, second barrier against moisture penetration into the active region 302.

According to the Griffith crack theory, during the propagation of a nascent crack induced by a mechanical dicing saw, the leading edge of the crack will stop at a point where the free surface energy of the crack is greater than the mechanical energy generated from the dicing saw. Based on this theory, embodiments of the invention provide a stepwise structure that not only inhibits cracks and the like, but also keeps moisture out of the active region 302. In the exemplary embodiment of FIGS. 3 and 4, the stepwise structure includes the following four structural stages, which collectively damp and contain nascent cracks generated during dicing and inhibit moisture from penetrating active region 302:

1. The first stage includes the irregular, staggered arrangement of SGPC features 309, which reduces metal density within the saw path, thereby reducing mechanical stress from the dicing saw blade on the silicon to reduce the incidence of nascent cracks and chips, which are a chief source of deterioration of silicon chip integrity.

2. The second stage includes the dummy metal region 306, which contains pluralities of vertically stacked dummy features 307, providing a protective barrier that damps mechanical energy generated during the saw-dicing process, so that cracks that do not have sufficient energy are inhibited from propagating towards the active region 302.

3. The third stage includes the first die-edge sealing ring 304, which is filled with a porous, low-k material that is substantially free or completely free of metal, and provides, around the active region 302, a protective barrier that increases crack surface energy and inhibits moisture penetration.

4. The fourth stage includes the second die-edge sealing ring 305, which is formed from a stack of alternating layers of metal 403 and interlayer dielectric layer (ILD) material 404, providing a protective barrier that damps mechanical crack energy, thereby inhibiting cracks from reaching active region 302, as well as serving as a barrier against moisture penetration.

In alternative embodiments, fewer than all four of the foregoing types of stages may be employed, the stages may be arranged in a different order from that shown in FIGS. 3 and 4, and more than one instance of a single type may be used (e.g., two different dummy metal regions disposed concentrically around an active region, or two separate first die-edge sealing rings filled with a low-k material disposed concentrically around an active region, or the like).

In some embodiments, one or more of (i) a first die-edge sealing ring including a low-k dielectric material, (ii) a second die-edge sealing ring formed from a stack of alternating layers of metal and interlayer dielectric layer (ILD) material, and (iii) a dummy metal region containing a plurality of stacked dummy metal features, or the like, may circumscribe more than a single active region.

The foregoing-described stepwise crack-inhibiting structure damps and contains nascent cracks generated during dicing and is also effective in preventing moisture penetrating an active region.

Embodiments of the invention not only provide increased protection against cracks, but also improve robustness of the saw-dicing process, and can even increase the production capacity of saw-dicing equipment, because a faster index speed for dicing can be employed without risk of die-edge chipping, peeling-induced die cracks, and related defects.

As used herein, the singular forms "a," "an," and "the" are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the invention has been described using relative terms such as "front," "back," "top," "bottom," "over," "above," "under," and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor wafer comprising an array of die regions separated by scribe lanes, wherein the wafer further comprises:
   an active region in a die region;
   a first ring at least partially surrounding the active region and within the die region, wherein at least a portion of the first ring comprises a low-k dielectric material;
   at least one of a dummy metal region that at least partially surrounds the active region, wherein the dummy metal region comprises a plurality of stacked dummy metal features disposed along at least one side of the die region, and a plurality of scribe-grid process-control (SGPC) features disposed alternately along opposing sides of a saw blade kerf region of a first scribe lane, such that the SGPC features are staggered with respect to each other and aligned along the opposing sides of the saw blade kerf region such that a saw blade will contact no more than one of the SGPC features at a time.

2. The semiconductor wafer of claim 1, wherein the low-k dielectric material fills a trench of the semiconductor wafer.

3. The semiconductor wafer of claim 1, wherein the first ring has a rectangular cross-section.

4. The semiconductor wafer of claim 1, wherein the first ring completely surrounds the active region.

5. The semiconductor wafer of claim 1, wherein the at least one die region further comprises a second ring at least partially surrounding the active region.

6. The semiconductor wafer of claim 5, wherein the second ring comprises a stack of alternating layers of metal and interlayer dielectric (ILD) material.

7. The semiconductor wafer of claim 1, wherein no portion of any of the stacked dummy metal features in the at least one die region extends into an adjacent saw blade kerf region.

8. The semiconductor wafer of claim 1, wherein the stacked dummy metal features include a plurality of first metal structures having generally L-shaped or V-shaped layouts.

9. The semiconductor wafer of claim 8, wherein each of the stacked dummy metal features includes at least one second metal structure having a generally rectangular cross section and disposed between a pair of the first metal structures, wherein the stacked dummy metal features are vertically spaced and disconnected from each other.

10. The semiconductor wafer of claim 1, wherein the first ring is substantially free or completely free of metal.

11. The semiconductor wafer of claim 1, wherein the low-k material is porous.

12. The semiconductor wafer of claim 1, wherein the low-k material comprises at least one of fluorinated SiO2, organosilane, and amorphous fluorocarbon.

13. The semiconductor wafer of claim 1, wherein the low-k material comprises at least one of carbon-doped silicon dioxide, porous silicon dioxide, porous carbon-doped silicon dioxide, a spin-on organic polymeric dielectric, and a spin-on silicon-based polymeric dielectric.

14. The semiconductor wafer of claim 1, wherein the low-k material has a dielectric constant value of less than 4.

15. The semiconductor wafer of claim 1, wherein no portion of any dummy metal feature in the at least one die region extends into an adjacent saw blade kerf region.

16. The semiconductor wafer of claim 5, wherein the second ring is located between the active region and the first ring.

17. The semiconductor wafer of claim 1, wherein the dummy metal region at least partially surrounds the first ring.

* * * * *